US010580879B2

(12) United States Patent
Wang et al.

(10) Patent No.: US 10,580,879 B2
(45) Date of Patent: Mar. 3, 2020

(54) ENHANCEMENT-MODE GAN-BASED HEMT DEVICE ON SI SUBSTRATE AND MANUFACTURING METHOD THEREOF

(71) Applicant: SOUTH CHINA UNIVERSITY OF TECHNOLOGY, Guangdong (CN)

(72) Inventors: Hong Wang, Guangdong (CN); Quanbin Zhou, Guangdong (CN); Qixin Li, Guangdong (CN)

(73) Assignee: SOUTH CHINA UNIVERSITY OF TECHNOLOGY, Guangdong (CN)

( * ) Notice: Subject to any disclaimer, the term of this patent is extended or adjusted under 35 U.S.C. 154(b) by 0 days.

(21) Appl. No.: 16/089,374

(22) PCT Filed: Feb. 15, 2017

(86) PCT No.: PCT/CN2017/073541
§ 371 (c)(1),
(2) Date: Sep. 28, 2018

(87) PCT Pub. No.: WO2018/120363
PCT Pub. Date: Jul. 5, 2018

(65) Prior Publication Data
US 2019/0109208 A1    Apr. 11, 2019

(30) Foreign Application Priority Data

Dec. 31, 2016 (CN) .......................... 2016 1 1269244
Dec. 31, 2016 (CN) .......................... 2016 1 1269252

(51) Int. Cl.
*H01L 29/205* (2006.01)
*H01L 29/66* (2006.01)
(Continued)

(52) U.S. Cl.
CPC .. *H01L 29/66431* (2013.01); *H01L 21/02507* (2013.01); *H01L 29/205* (2013.01);
(Continued)

(58) Field of Classification Search
CPC .............. H01L 29/2003; H01L 29/205; H01L 29/4236; H01L 29/66431; H01L 29/66462; H01L 29/778; H01L 29/7786
(Continued)

(56) References Cited

U.S. PATENT DOCUMENTS

2007/0164322 A1*  7/2007  Smith ............... H01L 29/42312
                                                    257/256
2014/0183598 A1*  7/2014  Chiu ................. H01L 29/42364
                                                    257/190
(Continued)

FOREIGN PATENT DOCUMENTS

| CN | 102664188 | 9/2012 |
| CN | 205177852 | 4/2016 |
| CN | 105637620 | 6/2016 |

OTHER PUBLICATIONS

"International Search Report (Form PCT/ISA/210)", dated Oct. 11, 2017, with English translation thereof, pp. 1-4.

*Primary Examiner* — Long K Tran
(74) *Attorney, Agent, or Firm* — JCIPRNET

(57) ABSTRACT

An enhancement-mode GaN-based HEMT device on Si substrate and a manufacturing method thereof. The device includes a Si substrate, an AlN nucleation layer, AlGaN transition layers, an AlGaN buffer layer, a low temperature AlN insertion layer, an AlGaN main buffer layer, an AlGaN/GaN superlattice layer, an GaN channel layer, and an AlGaN barrier layer. Both sides of a top end of the HEMT device are a source electrode and a drain electrode respectively, and a middle of the top end is a gate electrode. A middle of the AlGaN barrier layer is etched through to form a recess, and a bottom of the recess is connected to the GaN channel layer. A passivation protective layer and a gate dielectric layer are
(Continued)

deposited on the bottom of the recess, and the gate electrode is located above the dielectric layer.

14 Claims, 7 Drawing Sheets

(51) Int. Cl.
*H01L 29/778* (2006.01)
*H01L 21/02* (2006.01)
H01L 29/20 (2006.01)
H01L 29/423 (2006.01)

(52) U.S. Cl.
CPC ...... *H01L 29/66462* (2013.01); *H01L 29/778* (2013.01); *H01L 29/7786* (2013.01); H01L 21/0254 (2013.01); H01L 21/02381 (2013.01); H01L 21/02458 (2013.01); H01L 21/02505 (2013.01); H01L 29/2003 (2013.01); H01L 29/4236 (2013.01)

(58) Field of Classification Search
USPC .......................... 257/76, 190, 194; 438/182
See application file for complete search history.

(56) References Cited

U.S. PATENT DOCUMENTS

| | | | | |
|---|---|---|---|---|
| 2016/0293723 | A1* | 10/2016 | Chiu | H01L 29/42364 |
| 2017/0069720 | A1* | 3/2017 | Roberts | H01L 29/2003 |
| 2018/0151692 | A1* | 5/2018 | Chiu | H01L 29/42364 |

* cited by examiner

| AlGaN transition layer 105 |
| AlGaN transition layer 104 |
| AlGaN transition layer 103 |
| AlN nucleation layer 102 |
| Si substrate 101 |

FIG. 2c

| AlGaN buffer layer 106 |
| AlGaN transition layer 105 |
| AlGaN transition layer 104 |
| AlGaN transition layer 103 |
| AlN nucleation layer 102 |
| Si substrate 101 |

FIG. 2d

| low temperature AlN insertion layer 107 |
| AlGaN buffer layer 106 |
| AlGaN transition layer 105 |
| AlGaN transition layer 104 |
| AlGaN transition layer 103 |
| AlN nucleation layer 102 |
| Si substrate 101 |

FIG. 2e

| AlGaN main buffer layer 108 |
| low temperature AlN insertion layer 107 |
| AlGaN buffer layer 106 |
| AlGaN transition layer 105 |
| AlGaN transition layer 104 |
| AlGaN transition layer 103 |
| AlN nucleation layer 102 |
| Si substrate 101 |

FIG. 2f

| AlGaN/GaN superlattice layer 109 |
| AlGaN main buffer layer 108 |
| low temperature AlN insertion layer 107 |
| AlGaN buffer layer 106 |
| AlGaN transition layer 105 |
| AlGaN transition layer 104 |
| AlGaN transition layer 103 |
| AlN nucleation layer 102 |
| Si substrate 101 |

FIG. 2g

| GaN channel layer 110 |
| AlGaN/GaN superlattice layer 109 |
| AlGaN main buffer layer 108 |
| low temperature AlN insertion layer 107 |
| AlGaN buffer layer 106 |
| AlGaN transition layer 105 |
| AlGaN transition layer 104 |
| AlGaN transition layer 103 |
| AlN nucleation layer 102 |
| Si substrate 101 |

FIG. 2h

| AlGaN barrier layer 111 |
| GaN channel layer 110 |
| AlGaN/GaN superlattice layer 109 |
| AlGaN main buffer layer 108 |
| low temperature AlN insertion layer 107 |
| AlGaN buffer layer 106 |
| AlGaN transition layer 105 |
| AlGaN transition layer 104 |
| AlGaN transition layer 103 |
| AlN nucleation layer 102 |
| Si substrate 101 |

ENHANCEMENT-MODE GAN-BASED HEMT DEVICE ON SI SUBSTRATE AND MANUFACTURING METHOD THEREOF

CROSS-REFERENCE TO RELATED APPLICATION

This application is a 371 application of International PCT application serial no. PCT/CN2017/073541, filed on Feb. 15, 2017, which claims the priority benefit of Chinese application no. 201611269252.X, filed on Dec. 31, 2016, and Chinese application no. 201611269244.5, filed on Dec. 31, 2016. The entirety of each of the above-mentioned patent applications is hereby incorporated by reference herein and made a part of this specification.

BACKGROUND

Technical Field

The present invention belongs to the technical field of microelectronics and relates to semiconductor devices, in particular to an enhancement-mode GaN-based HEMT device on Si substrate and a manufacturing method thereof, which can be used in a high voltage and high power application and constitute a basic unit of a digital circuit.

Description of Related Art

With the development of modern weaponry and aerospace, nuclear power, communication technology, automotive electronics, and switching power supplies, higher requirements are placed on the performance of semiconductor devices. As a typical representative of wide-bandgap semiconductor materials, GaN-based material has the characteristics such large width of bandgap, high electron saturation drift velocity, high critical breakdown field strength, high thermal conductivity, good stability, corrosion resistance, radiation resistance and so on. In addition, GaN also has excellent electronic properties, and can form a modulation doped AlGaN/GaN heterostructure, with AlGaN. This structure, at room temperature, can obtain an electron mobility of higher than 1500 $cm^2/Vs$, a peak electron velocity of up to $3\times10^7$ cm/s, and a saturated electron velocity of $2\times10^7$ cm/s, and obtain a higher two-dimensional electron gas density than the second-generation compound semiconductor heterostructure. It is known as the ideal material for the development of microwave power devices. Therefore, the high electron mobility transistor HEMT based on AlGaN/GaN heterojunction has a very good application prospect in microwave high power devices.

GaN is a typical representative of the third generation of the semiconductor materials. It has excellent properties such as wide bandgap, high breakdown electric field, high frequency and high efficiency. GaN-based material and device are the development direction of the power electronics industry. To replace existing Si-based power electronic devices, GaN-based high-voltage material and device need to significantly reduce production costs while maintaining high performance. Preparation of GaN-based epitaxial material and device on a large-sized Si substrate is the best solution for balancing performance and cost. At present, a large number of high-tech companies and research institutes in China hope to grow a high-quality GaN-based high-voltage epitaxial material which is flat and crack-free, on a large-size (6 inches and above) Si substrate, combining with CMOS process development of the Si-based device at the same time, to develop 600V and 1200V high voltage switching device, to explore key physical mechanisms that affect performance and reliability of the device, and to perform application verification and product development to the fabricated devices.

Due to the large lattice mismatch (-17%) and thermal mismatch (116%) between GaN and Si substrates, it is very difficult for the monocrystalline GaN-based epitaxial material to grow flatly on the large-sized Si substrate. In particular, the thermal mismatch between the GaN-based material and the Si substrate introduces a large tensile stress (>1G Pascal) during the cooling process after the high-temperature growth of the GaN-based epitaxial material. This tensile stress due to thermal mismatch will cause the epitaxial wafer to be strongly warped or even cracked. How to avoid cracking of the epitaxial material when growing the GaN-based material on the Si substrate, and to reduce the bow of GaN-based epitaxial material on the large-sized Si substrate, are the most important technical difficulties in this field.

During the growth and the optimization of the GaN-based heterojunction structure on the large-sized Si substrate, the AlGaN barrier layer is subjected to the tensile stress applied by the GaN channel layer, and various defects are introduced by the release of stress into the heterojunction, thereby causing the degradation and reliability problems in the electrical performance of the GaN-based high voltage switching device. The growth of the GaN-based heterojunction structure on the Si substrate is more difficult, since the GaN-based material on the Si substrate have higher defect densities (including dislocations and background impurities), and the GaN-based material is subjected to greater stress. This stress will be accumulated with the stress in the heterojunction structure. More defects and larger stress will urge the accelerated release of stress in the GaN-based heterojunction structure on the Si substrate, which causes reliability problems of the device.

SUMMARY

The objective of the present invention is to overcome the defects of the prior art described above, and from the viewpoint of optimization of the longitudinal structure of the device, to propose an enhancement-mode GaN-based HEMT device on a Si substrate and a manufacturing method thereof, so as to reduce the process difficulty and improve the reliability of the device.

The objective of the present invention is achieved by at least one of the following technical solutions.

An enhancement-mode AlGaN/GaN heterojunction based HEMT device on a Si substrate, includes a Si substrate, an ANAN nucleation layer, AlGaN transition layers, an AlGaN buffer layer, a low temperature AlN insertion layer, an AlGaN main buffer layer, an AlGaN/GaN superlattice layer, an GaN channel layer, an AlGaN barrier layer which are stacked in turn from bottom to top; both sides of a top end of the HEMT device being a source electrode and a drain electrode respectively, and a middle of the top end being a gate electrode; a passivation protective layer being deposited on the AlGaN barrier layer, a middle of the AlGaN barrier layer and a middle of the passivation protective layer being etched through to form a recess, a bottom of the recess being connected to the GaN channel layer, the passivation protective layer and a dielectric layer being deposited on the bottom of the recess, the gate electrode being located above the dielectric layer, a MIS structure being formed by the passivation protective layer, the dielectric layer and the gate electrode jointly, the passivation protective layer on both sides above the AlGaN barrier layer being etched into the source electrode window and the drain electrode window, the source electrode window and the drain electrode window being respectively used for forming the source electrode and the drain electrode by evaporation.

Further, a size of the Si substrate is in the range of 2 inches to 10 inches.

Further, the AlGaN transition layers have a total of three layers, wherein molar contents of aluminium element in the AlGaN transition layers from bottom to top are in turn x, y, and z respectively, and the relationship of $1>x>y>z>0$ is satisfied.

Further, the AlGaN transition layers have a total of three layers, wherein thicknesses of the AlGaN transition layers from bottom to top are in turn h1, h2, and h3 respectively, and the relationship of $300\ nm>h3>h2>h1>50\ nm$ is satisfied.

Further, molar contents of aluminium element in the AlGaN buffer layer and the AlGaN main buffer layer are m and n respectively, and the relationships of $m>0$ and $n>0$ are satisfied.

Further, the low temperature AlN insertion layer is interposed between the AlGaN buffer layer and the AlGaN main buffer layer to reduce the cumulative stress of the material.

Further, the AlGaN/GaN superlattice layer is provided below the GaN channel layer, and has more than 5 periods.

Further, a channel of two-dimensional electron gas (2DEG) in high concentration is formed at an interface between the GaN channel layer and the AlGaN barrier layer.

Further, the AlGaN barrier layer is etched through to form a recess, the bottom of the recess and the GaN channel layer being in contact with each other.

Further, the passivation protective layer is deposited on the bottom of the recess as a gate insulating dielectric and the MIS structure is formed by the passivation protective layer, the dielectric layer and the gate electrode jointly.

Further, the passivation protective layer and the gate dielectric layer are deposited by PVD method or sputtering method.

Further, an alloy metal used for electrode metal of the source electrode and the drain electrode on both sides of the top end is a gold-free metal.

A preparation method of the enhancement-mode AlGaN/GaN heterojunction based HEMT device on the Si substrate, includes the steps of:

1) annealing a surface of the Si substrate in a reaction chamber of MOCVD system;
2) epitaxially growing the AlN nucleation layer on the substrate to provide a nucleation node for subsequent growth;
3) epitaxially growing the AlGaN transition layers, which have a total of three layers, on the basis of the AlN nucleation layer, wherein the molar contents of aluminium element in the AlGaN transition layers decrease in turn, and the thicknesses of the AlGaN transition layers increase in turn;
4) epitaxially growing the AlGaN buffer layer and the AlGaN main buffer layer as the main layers of the device material on the basis of the AlGaN transition layers, wherein the Al composition is greater than zero, and the low temperature AlN insertion layer is interposed therebetween to reduce the cumulative stress of the material;
5) epitaxially growing the AlGaN/GaN superlattice layer which has more than 5 periods, on the basis of the AlGaN main buffer layer;
6) epitaxially growing the GaN channel layer;
7) epitaxially growing the AlkGa(1-k)N barrier layer, the molar content k of the aluminium element in the AlkGa(1-k)N barrier layer satisfies $0.5>k>0.2$;
8) etching the AlGaN barrier layer and the GaN channel layer of the material for mesa isolation, separating the respective devices, the etching depth being in the range of 200 nm to 500 nm;
9) performing passivation protection: performing passivation protective layer deposition by PVD or CVD method to perform passivation protection for the device;
10) forming the gate electrode recess by etching, etching through the AlGaN barrier layer to form the recess, and connecting the bottom of the recess to the GaN channel layer;
11) depositing a $SiO_2$ passivation protective layer at the recess by PVD or CVD method, and simultaneously the $SiO_2$ passivation protective layer serving as a gate insulating dielectric layer;
12) depositing the gate electrode dielectric layer in the recess by sputtering method;
13) etching the $SiO_2$ passivation protective layer after photolithography to expose the source electrode window and the drain electrode window;
14) evaporating the Schottky contact metal and the ohmic contact metal in the gate electrode window, the source electrode window and the drain electrode window by electron beam evaporation technique, and after stripping and annealing, forming the gate electrode and the source contact electrode and the drain contact electrode;
15) having formed the surface of the gate electrode and the source contact electrode and the drain contact electrode by photolithography, obtaining a thickened electrode pattern, and thickening the electrodes by electron beam evaporation technique to complete the device fabrication.

Further, the annealing is performed at a temperature of 1100 degrees Celsius for 15 minutes.

Further, the accumulated mismatched stress of lattice is relieved by the low temperature AlN insertion layer and the AlGaN/GaN superlattice layer, and at same time, the crystal quality of the material is improved.

Compared with the prior art, the present invention following advantages and technical effects:

The device is an enhancement-mode GaN-based HEMT device on a Si substrate that makes it easier to achieve CMOS-compatible GaN electronic device process. At the same time, the enhanced MIS-HEMT is prepared on the depletion-mode epitaxial material by using the mature ALD and LPCVD insulating film growth techniques in CMOS. By optimizing the process conditions, on the one hand, it suppresses material failure, and on the other hand, improves the film quality. At the same time, the interface state of the semiconductor/dielectric layer is improved; a high-quality insulating gate dielectric is fabricated; the surface state is reduced, and a large gate voltage level is achieved, therefore it has characteristics of high threshold voltage, high breakdown voltage and high current density, and has excellent pinch-off characteristic, as well as the characteristics of simple manufacturing process and good reproducibility, and is suitable for applications such as high voltage and high power electronic devices.

DESCRIPTION OF THE EMBODIMENTS

The specific implementation of the present invention is further described below with reference to the accompanying drawings and embodiment, but the implementation and protection of the present invention are not limited thereto. It should be noted that, if any process or process parameters are not described in detail below, it can be achieved with reference to the prior art by those skilled in the art.

Figure 1:
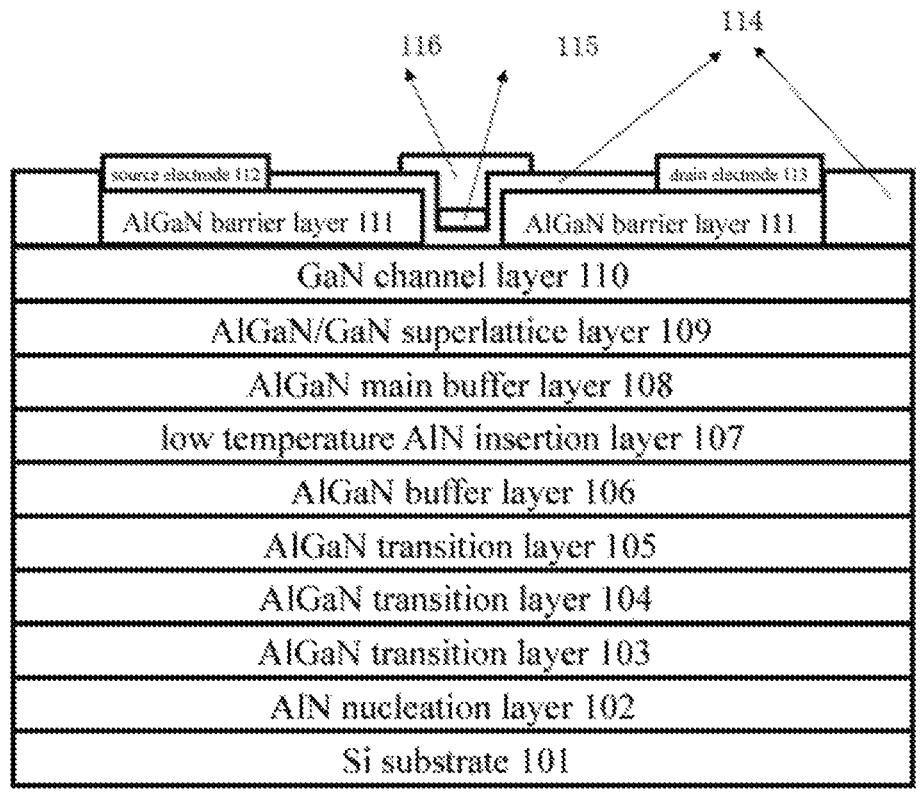
FIG. 1 is a schematic view of the structure of an enhancement-mode GaN-based HEMT device on a Si substrate in an embodiment of the present invention.

Referring to FIG. 1, an enhancement-mode GaN-based HEMT device on a Si substrate includes: a Si substrate 101, an AlN nucleation layer 102, AlGaN transition layers 103-105, an AlGaN buffer layer 106, a low temperature AlN insertion layer 107, an AlGaN main buffer layer 108, a AlGaN/GaN superlattice layer 109, a GaN channel layer 110, and a AlGaN barrier layer 111. Both sides of a top end of the HEMT device are a source electrode 112 and a drain electrode 113 respectively, and a middle of the top end is a gate electrode 116. A passivation protective layer 114 is deposited on the AlGaN barrier layer 111. A middle of the AlGaN barrier layer 111 and a middle of the passivation protective layer 114 are etched through to form a recess; a bottom of the recess is connected to the GaN channel layer 110, and the passivation protective layer 114 and a dielectric layer 115 is deposited on the bottom of the recess; the gate electrode 116 is located above the dielectric layer 115, and a MIS structure is formed by the passivation protective layer 114, the dielectric layer 115 and the gate electrode 116 jointly. The passivation protective layer 114 on both sides above the AlGaN barrier layer 111 is etched into the source electrode 112 window and the drain electrode 113 window. The source electrode 112 window and the drain electrode 113 window are respectively used for forming the source electrode 112 and the drain electrode 113 by evaporation.

The AlN nucleation layer 102 is epitaxially grown on the Si substrate 101. The $Al_xGa_{(1-x)}N$ transition layers (103-105) are epitaxially grown on the AlN nucleation layer 102 and has a total of three layers. The molar contents of the aluminium element in the $Al_xGa_{(1-x)}N$ transition layers 103-105 decrease in turn from bottom to top, whose values are 0.75, 0.40 and 0.2 respectively. The single layer thicknesses h of the $Al_xGa_{(1-x)}N$ transition layers (103-105) increase in turn, whose values are 140 nm, 190 nm and 240 nm, respectively. The AlmGa1-mN buffer layer 106 is epitaxially grown on the $Al_xGa_{(1-x)}N$ transition layers (103-105). The molar content of the aluminium element in the AlmGa1-mN buffer layer 106 is 7% and the thickness of the AlmGa1-mN buffer layer 106 is 200 nm. The low temperature AlN insertion layer 107 is epitaxially grown on the $Al_mGa_{(1-m)}N$ buffer layer 106 and the thickness of low temperature AlN insertion layer 107 is 10 nm. The $Al_nGa_{(1-n)}N$ main buffer layer 108 is epitaxially grown on the low temperature AlN insertion layer 107. The molar content of the aluminium element in the $Al_nGa_{(1-n)}N$ main buffer layer 108 is 5% and the thickness of the $Al_nGa_{(1-n)}N$ main buffer layer 108 is 1.2 μm. The $Al_iGa_{(1-i)}N$/GaN superlattice layer 109 is epitaxially grown on the $Al_nGa_{(1-n)}N$ main buffer layer 108 and has more than 5 periods, wherein the single layer thicknesses of the $Al_iGa_{(1-i)}N$ and GaN are 5 nm and 10 nm respectively, and the molar content of the aluminium element in $Al_iGa_{(1-i)}N$ is 10%. The GaN channel layer 110 is epitaxially grown on the $Al_iGa_{(1-i)}N$/GaN superlattice layer 109, and the thickness of the GaN channel layer 110 is 2.4 μm. The AlkGa(1-k)N barrier layer 111 is epitaxially grown on the GaN channel layer 110. The molar content of the aluminium element in the $Al_kGa_{(1-k)}N$ barrier layer 111 is 27%, the thickness of the AlkGa(1-k)N barrier layer 111 is 27 nm. The AlGaN layer and the GaN layer of the material are etched for mesa isolation, and the respective devices are separated, and the etching depth is 200 nm. Passivation protection is performed: 200 nm $SiO_2$ is deposited as a passivation protective layer by PECVD method to perform passivation protection for the device. The middle regions of the 200 nm $SiO_2$ passivation protective layer and the barrier layer $AlkGa_{(1-k)}$ are etched away to form the gate electrode recess.

The AlkGa(i-k)N barrier layer 111 is etched through to form the recess, and the bottom of the recess is connected to the GaN channel layer 110. 20 nm $SiO_2$ gate electrode insulating layer is deposited by PECVD. 100 nm TiN is deposited as the gate electrode dielectric layer by magnetron sputtering method. 220 nm $SiO_2$ passivation protective layer after photolithography is etched in both end regions to form the source electrode window and the drain electrode window; four layer metals Ti/Al/Ti/TiN=20 nm/130 nm/25 nm/70 nm are evaporated as the Schottky contact metal and the ohmic contact metal by electron beam evaporation technique to form the gate electrode, the source contact electrode and the drain contact electrode after being stripped and annealed. The surface of the source electrode and the drain electrode and the gate electrode has been formed by photolithography. A thickened electrode pattern is obtained. The electrode is thickened by electron beam evaporation technique to complete the device fabrication.

Figure 2A:
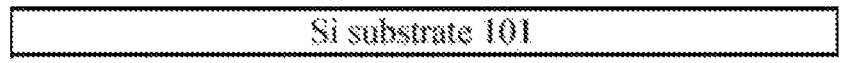
FIGS. 2a to 2n are schematic views showing a preparation process of the enhancement-mode GaN-based HEMT device on a Si substrate in the embodiment of the present invention.
Figure 2B:
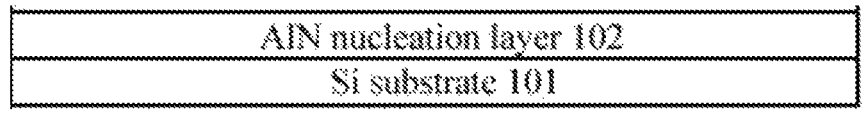
Figures 2I, 2J:
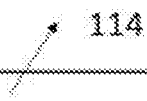
Figure 2K:
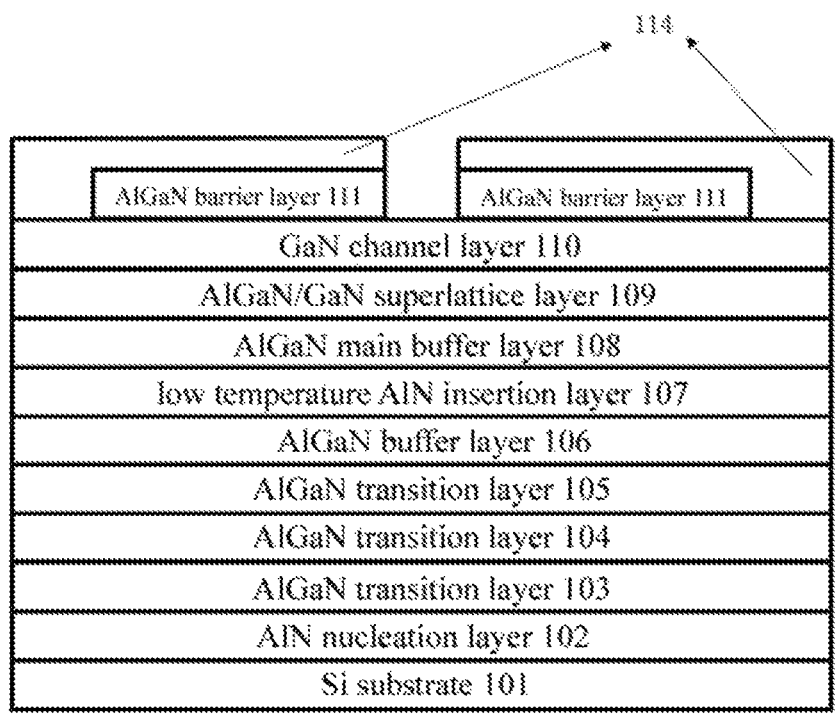
Figure 2L:
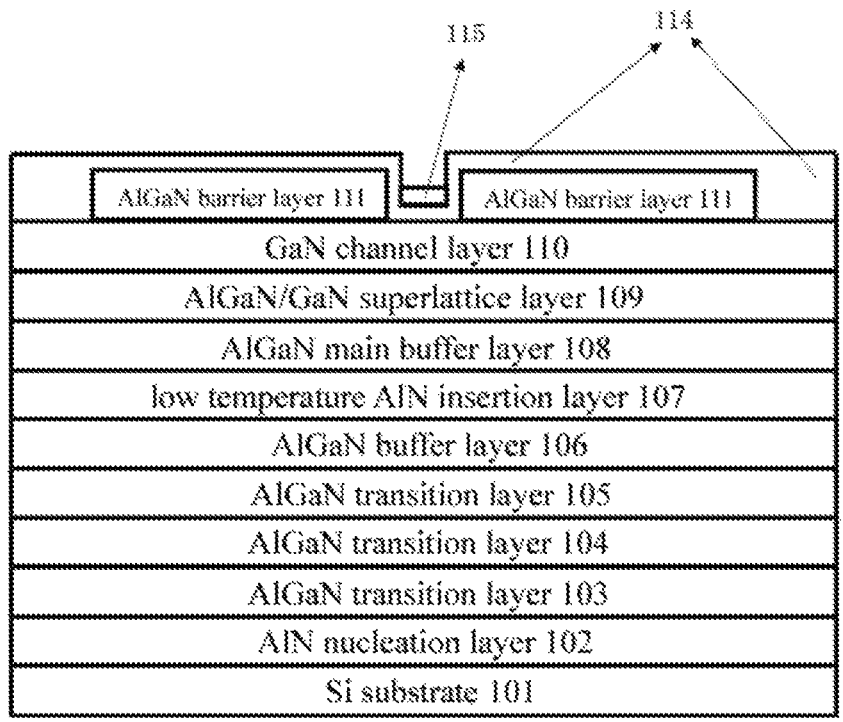
Figure 2M:
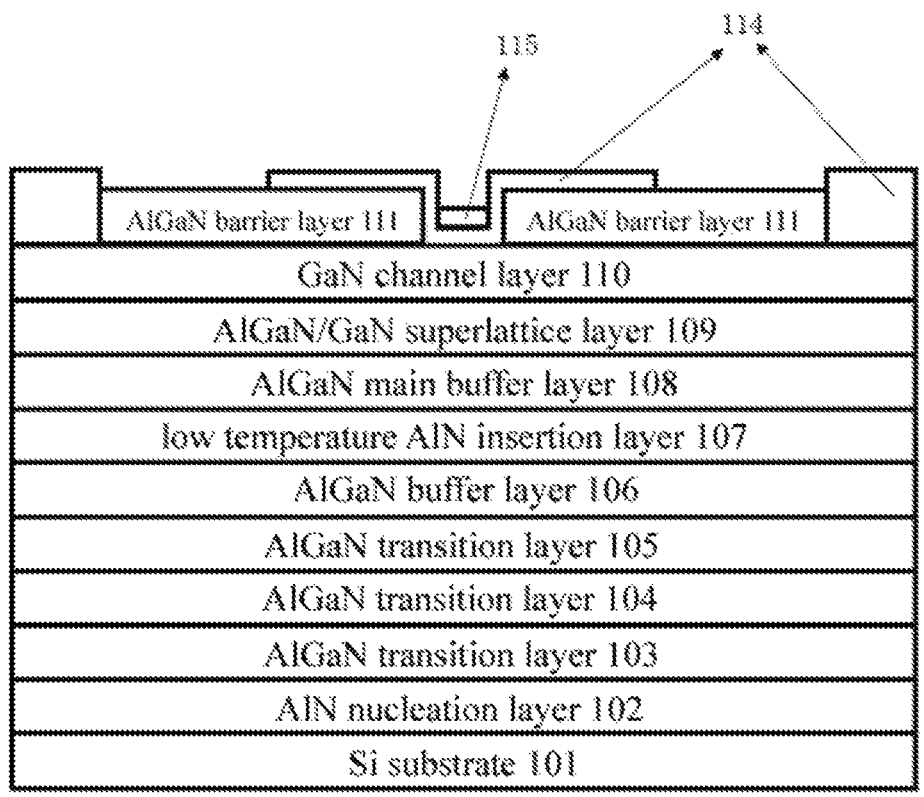
Figure 2N:
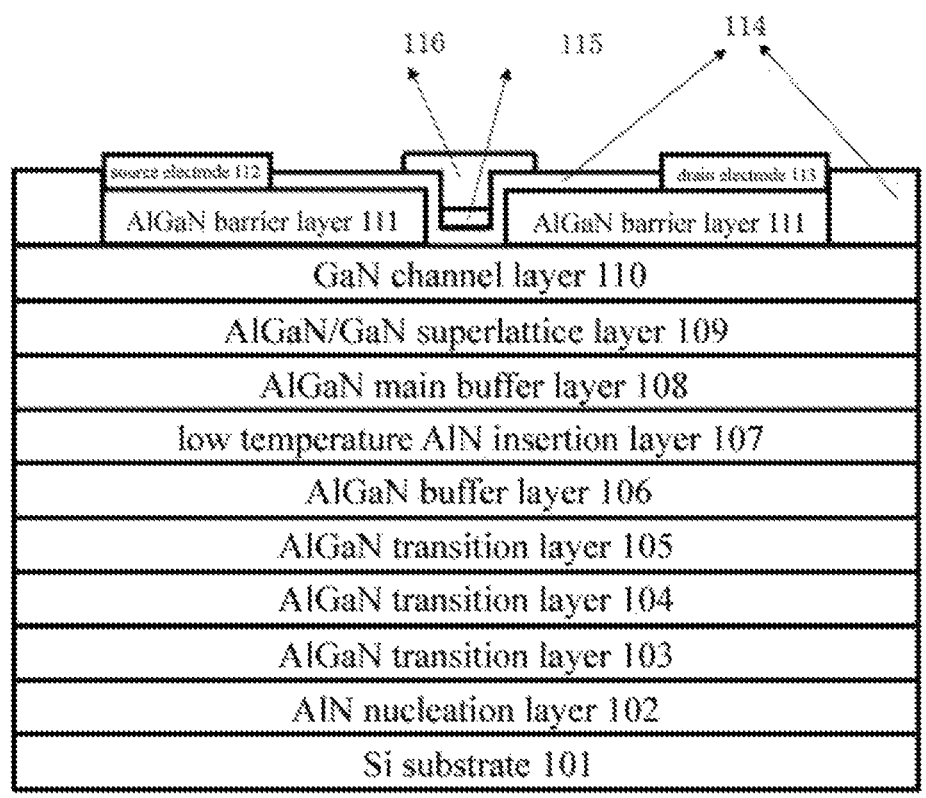

For example, as shown in FIG. 2a to FIG. 2n, the specific implementation steps are as follows:

step 1: annealing the substrate at a temperature of 1100 degrees Celsius for 15 minutes.

step 2: epitaxially growing the AlN nucleation layer 102 is on the Si substrate 101.

step 3: epitaxially growing the $Al_xGa_{(1-x)}N$ transition layers (103-105), which have a total of three layers, on the AlN nucleation layer 102, wherein the molar contents of aluminium element in the $Al_xGa_{(1-x)}N$ transition layers (103-105) decrease in turn, whose values are 0.75, 0.40 and 0.2 respectively, and the single layer thicknesses h of the $Al_xGa_{(1-x)}N$ transition layers (103-105) increase in turn, whose values are 140 nm, 190 nm and 240 nm, respectively.

step 4: epitaxially growing the $Al_mGa_{(1-m)}N$ buffer layer 106 on the $Al_xGa_{(1-x)}N$ transition layers (103-105), wherein the molar content of aluminium element of in the $Al_mGa_{(1-m)}N$ buffer layer 106 is 7% and the thickness of the $Al_mGa_{(1-m)}N$ buffer layer 106 is 200 nm.

step 5: epitaxially growing the low temperature AlN insertion layer 107 on the $Al_mGa_{(1-m)}N$ buffer layer 106, wherein the thickness of the low temperature AlN insertion layer 107 is 10 nm.

step 6: epitaxially growing the $Al_nGa_{(1-n)}N$ main buffer layer 108 on the low temperature AlN insertion layer 107, wherein the molar content of the aluminium element in the $Al_nGa_{(1-n)}N$ main buffer layer 108 is 5% and the thickness of the $Al_nGa_{(1-n)}N$ main buffer layer 108 is 1.2 μm.

step 7: epitaxially growing the $Al_iGa_{(1-i)}N$/GaN superlattice layer 109, which has 8 periods, on the $Al_nGa_{(1-n)}N$ main buffer layer 108, wherein the single layer thicknesses of the $Al_iGa_{(1-i)}N$ and GaN are 5 nm and 10 nm respectively, and the molar content of the aluminium element in $Al_iGa_{(1-i)}N$ is 10%.

step 8: epitaxially growing the GaN channel layer 110 on the $Al_tGa_{(1-t)}N$/GaN superlattice layer 109, wherein the thickness of the GaN channel layer 110 is 2.4 µm.

step 9: epitaxially growing the $Al_kGa_{(1-k)}N$ barrier layer 111 on the GaN channel layer 110, wherein the molar content of aluminium element in the $Al_kGa_{(1-k)}N$ barrier layer 111 is 27% and the thickness of the $Al_kGa_{(1-k)}N$ barrier layer 111 is 27 nm.

step 10: etching the AlGaN barrier layer 111 and the GaN channel layer 110 of the material for mesa isolation, separating the respective devices, wherein the etching depth is 200 nm.

step 11: performing passivation protection: depositing 200 nm $SiO_2$ as a passivation protective layer by PECVD method to perform passivation protection for the device.

step 12: etching away the middle regions of the 200 nm $SiO_2$ passivation protective layer and the barrier layer $AlkGa_{(1-k)}$ to form the gate electrode recess, etching through the $AlkGa_{(1-k)}N$ barrier layer 111 to form the recess, and connecting the bottom of the recess to the GaN channel layer 110.

step 13: depositing 20 nm $SiO_2$ by PECVD method to form the gate insulating dielectric.

step 14: depositing 100 nm TiN as the gate dielectric layer in the recess by magnetron sputtering method.

step 15: etching 220 nm $SiO_2$ passivation protective layer after photolithography at both end regions to form the source electrode window and the drain electrode window.

step 16: evaporating four layer metals Ti/Al/Ti/TiN=20 nm/130 nm/25 nm/70 nm as the Schottky contact metal and the ohmic contact metal in the gate electrode dielectric layer, the source electrode window and the drain electrode window by electron beam evaporation technique, after stripping and annealing, forming the gate electrode, and the source electrode and the drain contact electrode.

step 17: having formed the surface of the source electrode, the drain electrode, and the gate electrode by photolithography, obtaining a thickened electrode pattern, and thickening the electrodes by electron beam evaporation technique to complete the device fabrication.

Figure 3:
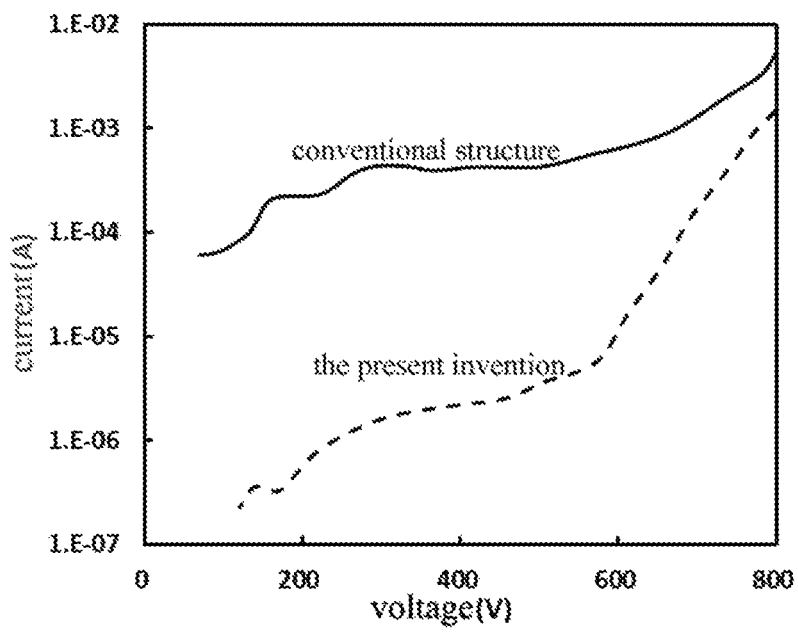
FIG. 3 shows current-voltage curves of the present invention and the conventional structure.

The device is an enhancement-mode GaN-based HEMT device on a Si substrate that makes it easier to achieve CMOS-compatible GaN electronic device process. At the same time, the enhanced MIS-HEMT is prepared on the depletion-mode epitaxial material by using the mature ALD and LPCVD insulating film growth techniques in CMOS. By optimizing the process conditions, on the one hand, it suppresses material failure, and on the other hand, improves the film quality. At the same time, the interface state of the semiconductor/dielectric layer is improved; a high-quality insulating gate dielectric is fabricated; the surface state is reduced, and a large gate voltage level is achieved, therefore it has characteristics of high threshold voltage, high breakdown voltage and high current density, and has excellent pinch-off characteristic, as well as the characteristics of simple manufacturing process and good reproducibility, and is suitable for applications such as high voltage and high power electronic devices. As shown in FIG. 3, compared with the conventional structure, the leakage current of the present invention is significantly reduced.

The embodiment described above is merely preferred embodiment of the present invention, and are not intended to limit the scope of the present invention. It is obvious to those skilled in the art that various modifications and changes in form and detail can be made according to the method of the present invention without departing from the principles and scope of the present invention, after understanding the contents and principles of the present invention. However, such modifications and changes based on the present invention still fall within the scope of the claims of the present invention.

What is claimed is:

1. A enhancement-mode GaN-based HEMT device on a Si substrate, comprising a Si substrate, an AlN nucleation layer, AlGaN transition layers, an AlGaN buffer layer, a low temperature AlN insertion layer, an AlGaN main buffer layer, an AlGaN/GaN superlattice layer, an GaN channel layer, and an AlGaN barrier layer which are stacked in turn from bottom to top,
wherein both sides of a top end of the HEMT device are a source electrode and a drain electrode, and a middle of the top end is a gate electrode,
wherein a passivation protective layer is deposited on the AlGaN barrier layer, a middle of the AlGaN barrier layer and a middle of the passivation protective layer are etched through to form a recess, a bottom of the recess is connected to the GaN channel layer, the passivation protective layer and a dielectric layer are deposited on the bottom of the recess, the gate electrode is located above the dielectric layer, a MIS structure is formed by the passivation protective layer, the dielectric layer and the gate electrode jointly, the passivation protective layer on both sides above the AlGaN barrier layer is etched into a source electrode window and a drain electrode window, the source electrode window and the drain electrode window are respectively used for forming the source electrode and the drain electrode by evaporation.

2. The enhancement-mode GaN-based HEMT device on the Si substrate according to claim 1, wherein a size of the Si substrate is in the range of 2 inches to 10 inches.

3. The enhancement-mode GaN-based HEMT device on the Si substrate according to claim 1, wherein the AlGaN transition layers have a total of three layers, wherein molar contents of aluminium element in the AlGaN transition layers from bottom to top are in turn x, y, and z respectively, and the relationship of $1>x>y>z>0$ is satisfied, wherein thicknesses of the AlGaN transition layers from bottom to top are in turn h1, h2, and h3 respectively, and the relationship of $300\ nm>h3>h2>h1>50\ nm$ is satisfied.

4. The enhancement-mode GaN-based HEMT device on the Si substrate according to claim 1, wherein molar contents of aluminium element in the AlGaN buffer layer and the AlGaN main buffer layer are m and n respectively, and the relationships of $m>0$ and $n>0$ are satisfied.

5. The enhancement-mode GaN-based HEMT device on the Si substrate according to claim 1, wherein the AlGaN/GaN superlattice layer is provided below the GaN channel layer, and has more than 5 periods.

6. The enhancement-mode GaN-based HEMT device on the Si substrate according to claim 1, wherein a channel of two-dimensional electron gas (2DEG) in high concentration is formed at an interface between the GaN channel layer and the AlGaN barrier layer.

7. The enhancement-mode GaN-based HEMT device on the Si substrate according to claim 1, wherein an alloy metal used for electrode metal of the source electrode and the drain electrode on both sides of the top end is a gold-free metal.

8. A preparation method of the enhancement-mode GaN-based HEMT device on the Si substrate according to claim 1, comprising:
1) annealing a surface of the Si substrate in a reaction chamber at a temperature of 1100 degrees Celsius for 15 minutes;

2) epitaxially growing the AlN nucleation layer on the substrate to provide a nucleation node for subsequent growth;
3) epitaxially growing the AlGaN transition layers, which have a total of three layers, on the basis of the AlN nucleation layer, wherein molar contents of aluminium element in the AlGaN transition layers decrease in turn, and the thicknesses of the AlGaN transition layers increase in turn;
4) epitaxially growing the AlGaN buffer layer and the AlGaN main buffer layer as the main layers of the device material on the basis of the AlGaN transition layers, wherein the Al composition is greater than zero, and the low temperature AlN insertion layer is interposed therebetween to reduce the cumulative stress of the material;
5) epitaxially growing the AlGaN/GaN superlattice layer which has more than 5 periods, on the basis of the AlGaN main buffer layer;
6) epitaxially growing the GaN channel layer;
7) epitaxially growing the $AlkGa_{(1-k)N}$ barrier layer, a molar content k of the aluminium element in the $AlkGa_{(1-k)N}$ barrier layer satisfies 0.5>k>0.2;
8) etching the AlGaN barrier layer and the GaN channel layer of the material for mesa isolation, separating the respective devices, a etching depth is in the range of 200 nm to 500 nm;
9) passivation protection: performing passivation protective layer deposition by PVD or CVD method or sputtering method to perform passivation protection for the device;
10) forming a gate electrode recess by etching, etching through the AlGaN barrier layer to form the recess, and connecting the bottom of the recess to the GaN channel layer;
11) depositing a $SiO_2$ passivation protective layer at the recess by PVD or CVD method, and simultaneously the $SiO_2$ passivation protective layer serving as a gate insulating dielectric layer;
12) depositing a gate electrode dielectric layer in the recess by sputtering method;
13) etching the $SiO_2$ passivation protective layer after photolithography to expose the source electrode window and the drain electrode window;
14) evaporating the Schottky contact metal and the ohmic contact metal in the gate electrode window, the source electrode window and the drain electrode window by electron beam evaporation technique, and after stripping and annealing, forming the gate electrode, a source contact electrode and a drain contact electrode;
15) having formed the surface of the gate electrode, the source electrode and the drain electrode by photolithography, obtaining a thickened electrode pattern, and thickening the electrodes by electron beam evaporation technique to complete the device fabrication.

9. A preparation method of the enhancement-mode GaN-based HEMT device on the Si substrate according to claim 2, comprising:
1) annealing a surface of the Si substrate in a reaction chamber at a temperature of 1100 degrees Celsius for 15 minutes;
2) epitaxially growing the AlN nucleation layer on the substrate to provide a nucleation node for subsequent growth;
3) epitaxially growing the AlGaN transition layers, which have a total of three layers, on the basis of the AlN nucleation layer, wherein molar contents of aluminium element in the AlGaN transition layers decrease in turn, and thicknesses of the AlGaN transition layers increase in turn;
4) epitaxially growing the AlGaN buffer layer and the AlGaN main buffer layer as the main layers of the device material on the basis of the AlGaN transition layers, wherein the Al composition is greater than zero, and the low temperature AlN insertion layer is interposed therebetween to reduce the cumulative stress of the material;
5) epitaxially growing the AlGaN/GaN superlattice layer which has more than 5 periods, on the basis of the AlGaN main buffer layer;
6) epitaxially growing the GaN channel layer;
7) epitaxially growing the $AlkGa_{(1-k)N}$ barrier layer, a molar content k of the aluminium element in the $AlkGa_{(1-k)N}$ barrier layer satisfies 0.5>k>0.2;
8) etching the AlGaN barrier layer and the GaN channel layer of the material for mesa isolation, separating the respective devices, a etching depth is in the range of 200 nm to 500 nm;
9) passivation protection: performing passivation protective layer deposition by PVD or CVD method or sputtering method to perform passivation protection for the device;
10) forming a gate electrode recess by etching, etching through the AlGaN barrier layer (110);
11) depositing a $SiO_2$ passivation protective layer at the recess by PVD or CVD method, and simultaneously the $SiO_2$ passivation protective layer serving as a gate insulating dielectric layer;
12) depositing a gate electrode dielectric layer in the recess by sputtering method;
13) etching the $SiO_2$ passivation protective layer after photolithography to expose the source electrode window and the drain electrode window;
14) evaporating the Schottky contact metal and the ohmic contact metal in the gate electrode window, the source electrode window and the drain electrode window by electron beam evaporation technique, and after stripping and annealing, forming the gate electrode, a source contact electrode and a drain contact electrode;
15) having formed the surface of the gate electrode, the source electrode and the drain electrode by photolithography, obtaining a thickened electrode pattern, and thickening the electrodes by electron beam evaporation technique to complete the device fabrication.

10. A preparation method of the enhancement-mode GaN-based HEMT device on the Si substrate according to claim 3, comprising:
1) annealing a surface of the Si substrate in a reaction chamber at a temperature of 1100 degrees Celsius for 15 minutes;
2) epitaxially growing the AlN nucleation layer on the substrate to provide a nucleation node for subsequent growth;
3) epitaxially growing the AlGaN transition layers, which have a total of three layers, on the basis of the AlN nucleation layer, wherein the molar contents of aluminium element in the AlGaN transition layers decrease in turn, and the thicknesses of the AlGaN transition layers increase in turn;
4) epitaxially growing the AlGaN buffer layer and the AlGaN main buffer layer as the main layers of the device material on the basis of the AlGaN transition layers, wherein the Al composition is greater than zero, and the low temperature AlN insertion layer is interposed therebetween to reduce the cumulative stress of the material;
5) epitaxially growing the AlGaN/GaN superlattice layer which has more than 5 periods, on the basis of the AlGaN main buffer layer;
6) epitaxially growing the GaN channel layer;
7) epitaxially growing the AlkGa$_{(1-k)N}$ barrier layer, a molar content k of the aluminium element in the AlkGa$_{(1-k)N}$ barrier layer satisfies 0.5>k>0.2;
8) etching the AlGaN barrier layer and the GaN channel layer of the material for mesa isolation, separating the respective devices, a etching depth is in the range of 200 nm to 500 nm;
9) passivation protection: performing passivation protective layer deposition by PVD or CVD method or sputtering method to perform passivation protection for the device;
10) forming a gate electrode recess by etching, etching through the AlGaN barrier layer to form the recess, and connecting the bottom of the recess to the GaN channel layer;
11) depositing a SiO$_2$ passivation protective layer at the recess by PVD or CVD method, and simultaneously the SiO$_2$ passivation protective layer serving as a gate insulating dielectric layer;
12) depositing a gate electrode dielectric layer in the recess by sputtering method;
13) etching the SiO$_2$ passivation protective layer after photolithography to expose the source electrode window and the drain electrode window;
14) evaporating the Schottky contact metal and the ohmic contact metal in the gate electrode window, the source electrode window and the drain electrode window by electron beam evaporation technique, and after stripping and annealing, forming the gate electrode, a source contact electrode and a drain contact electrode;
15) having formed the surface of the gate electrode, the source electrode and the drain electrode by photolithography, obtaining a thickened electrode pattern, and thickening the electrodes by electron beam evaporation technique to complete the device fabrication.

11. A preparation method of the enhancement-mode GaN-based HEMT device on the Si substrate according to claim 4, comprising:
1) annealing a surface of the Si substrate in a reaction chamber at a temperature of 1100 degrees Celsius for 15 minutes;
2) epitaxially growing the AlN nucleation layer on the substrate to provide a nucleation node for subsequent growth;
3) epitaxially growing the AlGaN transition layers, which have a total of three layers, on the basis of the AlN nucleation layer, wherein the molar contents of aluminium element in the AlGaN transition layers decrease in turn, and thicknesses of the AlGaN transition layers increase in turn;
4) epitaxially growing the AlGaN buffer layer and the AlGaN main buffer layer as the main layers of the device material on the basis of the AlGaN transition layers, wherein the Al composition is greater than zero, and the low temperature AlN insertion layer is interposed therebetween to reduce the cumulative stress of the material;
5) epitaxially growing the AlGaN/GaN superlattice layer which has more than 5 periods, on the basis of the AlGaN main buffer layer;
6) epitaxially growing the GaN channel layer;
7) epitaxially growing the AlkGa$_{(1-k)N}$ barrier layer, a molar content k of the aluminium element in the AlkGa$_{(1-k)N}$ barrier layer satisfies 0.5>k>0.2;
8) etching the AlGaN barrier layer and the GaN channel layer of the material for mesa isolation, separating the respective devices, a etching depth is in the range of 200 nm to 500 nm;
9) passivation protection: performing passivation protective layer deposition by PVD or CVD method or sputtering method to perform passivation protection for the device;
10) forming a gate electrode recess by etching, etching through the AlGaN barrier layer to form the recess, and connecting the bottom of the recess to the GaN channel layer;
11) depositing a SiO$_2$ passivation protective layer at the recess by PVD or CVD method, and simultaneously the SiO$_2$ passivation protective layer serving as a gate insulating dielectric layer;
12) depositing a gate electrode dielectric layer in the recess by sputtering method;
13) etching the SiO$_2$ passivation protective layer after photolithography to expose the source electrode window and the drain electrode window;
14) evaporating the Schottky contact metal and the ohmic contact metal in the gate electrode window, the source electrode window and the drain electrode window by electron beam evaporation technique, and after stripping and annealing, forming the gate electrode, a source contact electrode and a drain contact electrode;
15) having formed the surface of the gate electrode, the source electrode and the drain electrode by photolithography, obtaining a thickened electrode pattern, and thickening the electrodes by electron beam evaporation technique to complete the device fabrication.

12. A preparation method of the enhancement-mode GaN-based HEMT device on the Si substrate according to claim 5, comprising:
1) annealing a surface of the Si substrate in a reaction chamber at a temperature of 1100 degrees Celsius for 15 minutes;
2) epitaxially growing the AlN nucleation layer on the substrate to provide a nucleation node for subsequent growth;
3) epitaxially growing the AlGaN transition layers, which have a total of three layers, on the basis of the AlN nucleation layer, wherein molar contents of aluminium element in the AlGaN transition layers decrease in turn, and thicknesses of the AlGaN transition layers increase in turn;
4) epitaxially growing the AlGaN buffer layer and the AlGaN main buffer layer as the main layers of the device material on the basis of the AlGaN transition layers, wherein the Al composition is greater than zero, and the low temperature AlN insertion layer is interposed therebetween to reduce the cumulative stress of the material;
5) epitaxially growing the AlGaN/GaN superlattice layer which has more than 5 periods, on the basis of the AlGaN main buffer layer;
6) epitaxially growing the GaN channel layer;
7) epitaxially growing the AlkGa$_{(1-k)N}$ barrier layer, a molar content k of the aluminium element in the AlkGa$_{(1-k)N}$ barrier layer satisfies 0.5>k>0.2;

8) etching the AlGaN barrier layer and the GaN channel layer of the material for mesa isolation, separating the respective devices, a etching depth is in the range of 200 nm to 500 nm;

9) passivation protection: performing passivation protective layer deposition by PVD or CVD method or sputtering method to perform passivation protection for the device;

10) forming a gate electrode recess by etching, etching through the AlGaN barrier layer to form the recess, and connecting the bottom of the recess to the GaN channel layer;

11) depositing a $SiO_2$ passivation protective layer at the recess by PVD or CVD method, and simultaneously the $SiO_z$ passivation protective layer serving as a gate insulating dielectric layer;

12) depositing a gate electrode dielectric layer in the recess by sputtering method;

13) etching the $SiO_2$ passivation protective layer after photolithography to expose the source electrode window and the drain electrode window;

14) evaporating the Schottky contact metal and the ohmic contact metal in the gate electrode window, the source electrode window and the drain electrode window by electron beam evaporation technique, and after stripping and annealing, forming the gate electrode, a source contact electrode and a drain contact electrode;

15) having formed the surface of the gate electrode, the source electrode and the drain electrode by photolithography, obtaining a thickened electrode pattern, and thickening the electrodes by electron beam evaporation technique to complete the device fabrication.

13. A preparation method of the enhancement-mode GaN-based HEMT device on the Si substrate according to claim 6, comprising:

1) annealing a surface of the Si substrate in a reaction chamber at a temperature of 1100 degrees Celsius for 15 minutes;

2) epitaxially growing the AlN nucleation layer on the substrate to provide a nucleation node for subsequent growth;

3) epitaxially growing the AlGaN transition layers, which have a total of three layers, on the basis of the AlN nucleation layer, wherein molar contents of aluminium element in the AlGaN transition layers decrease in turn, and thicknesses of the AlGaN transition layers increase in turn;

4) epitaxially growing the AlGaN buffer layer and the AlGaN main buffer layer as the main layers of the device material on the basis of the AlGaN transition layers, wherein the Al composition is greater than zero, and the low temperature AlN insertion layer is interposed therebetween to reduce the cumulative stress of the material;

5) epitaxially growing the AlGaN/GaN superlattice layer which has more than 5 periods, on the basis of the AlGaN main buffer layer;

6) epitaxially growing the GaN channel layer;

7) epitaxially growing the $AlkGa_{(1-k)N}$ barrier layer, a molar content k of the aluminium element in the $AlkGa_{(1-k)N}$ barrier layer satisfies $0.5>k>0.2$;

8) etching the AlGaN barrier layer and the GaN channel layer of the material for mesa isolation, separating the respective devices, a etching depth is in the range of 200 nm to 500 nm;

9) passivation protection: performing passivation protective layer deposition by PVD or CVD method or sputtering method to perform passivation protection for the device;

10) forming a gate electrode recess by etching, etching through the AlGaN barrier layer to form the recess, and connecting the bottom of the recess to the GaN channel layer;

11) depositing a $SiO_2$ passivation protective layer at the recess by PVD or CVD method, and simultaneously the $SiO_2$ passivation protective layer serving as a gate insulating dielectric layer;

12) depositing a gate electrode dielectric layer in the recess by sputtering method;

13) etching the $SiO_2$ passivation protective layer after photolithography to expose the source electrode window and the drain electrode window;

14) evaporating the Schottky contact metal and the ohmic contact metal in the gate electrode window, the source electrode window and the drain electrode window by electron beam evaporation technique, and after stripping and annealing, forming the gate electrode, a source contact electrode and a drain contact electrode;

15) having formed the surface of the gate electrode, the source electrode and the drain electrode by photolithography, obtaining a thickened electrode pattern, and thickening the electrodes by electron beam evaporation technique to complete the device fabrication.

14. A preparation method of the enhancement-mode GaN-based HEMT device on the Si substrate according to claim 7, comprising:

1) annealing a surface of the Si substrate in a reaction chamber at a temperature of 1100 degrees Celsius for 15 minutes;

2) epitaxially growing the AlN nucleation layer on the substrate to provide a nucleation node for subsequent growth;

3) epitaxially growing the AlGaN transition layers, which have a total of three layers, on the basis of the AlN nucleation layer, wherein molar contents of aluminium element in the AlGaN transition layers decrease in turn, and thicknesses of the AlGaN transition layers increase in turn;

4) epitaxially growing the AlGaN buffer layer and the AlGaN main buffer layer as the main layers of the device material on the basis of the AlGaN transition layers, wherein the Al composition is greater than zero, and the low temperature AlN insertion layer is interposed therebetween to reduce the cumulative stress of the material;

5) epitaxially growing the AlGaN/GaN superlattice layer which has more than 5 periods, on the basis of the AlGaN main buffer layer;

6) epitaxially growing the GaN channel layer;

7) epitaxially growing the $AlkGa_{(1-k)N}$ barrier layer, a molar content k of the aluminium element in the $AlkGa_{(1-k)N}$ barrier layer satisfies $0.5>k>0.2$;

8) etching the AlGaN barrier layer and the GaN channel layer of the material for mesa isolation, separating the respective devices, a etching depth is in the range of 200 nm to 500 nm;

9) passivation protection: performing passivation protective layer deposition by PVD or CVD method or sputtering method to perform passivation protection for the device;

10) forming a gate electrode recess by etching, etching through the AlGaN barrier layer to form the recess, and connecting the bottom of the recess to the GaN channel layer;
11) depositing a $SiO_2$ passivation protective layer at the recess by PVD or CVD method, and simultaneously the $SiO_2$ passivation protective layer serving as a gate insulating dielectric layer;
12) depositing a gate electrode dielectric layer in the recess by sputtering method;
13) etching the $SiO_2$ passivation protective layer after photolithography to expose the source electrode window and the drain electrode window;
14) evaporating the Schottky contact metal and the ohmic contact metal in the gate electrode window, the source electrode window and the drain electrode window by electron beam evaporation technique, and after stripping and annealing, forming the gate electrode, a source contact electrode and a drain contact electrode;
15) having formed the surface of the gate electrode, the source electrode and the drain electrode by photolithography, obtaining a thickened electrode pattern, and thickening the electrodes by electron beam evaporation technique to complete the device fabrication.

* * * * *